(12) United States Patent
Uchino et al.

(10) Patent No.: US 11,996,829 B2
(45) Date of Patent: May 28, 2024

(54) CONTROL DEVICE, CONTROL METHOD, AND COMPUTER PROGRAM

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Takeo Uchino, Yokkaichi (JP); Shunichi Sawano, Yokkaichi (JP); Masayuki Kato, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 844 days.

(21) Appl. No.: 17/040,885

(22) PCT Filed: Mar. 6, 2019

(86) PCT No.: PCT/JP2019/008780
§ 371 (c)(1),
(2) Date: Sep. 23, 2020

(87) PCT Pub. No.: WO2019/181495
PCT Pub. Date: Sep. 26, 2019

(65) Prior Publication Data
US 2021/0006241 A1 Jan. 7, 2021

(30) Foreign Application Priority Data
Mar. 23, 2018 (JP) .................. 2018-056897

(51) Int. Cl.
*H03K 17/081* (2006.01)
*H02J 7/00* (2006.01)
*H03K 17/00* (2006.01)

(52) U.S. Cl.
CPC ...... *H03K 17/08116* (2013.01); *H02J 7/0024* (2013.01); *H02J 7/0063* (2013.01); *H03K 17/002* (2013.01)

(58) Field of Classification Search
CPC .... H03K 17/00; H03K 17/002; H03K 17/005; H03K 17/007; H03K 17/08;
(Continued)

(56) References Cited

U.S. PATENT DOCUMENTS

2008/0143298 A1   6/2008 Yoshida
2015/0377931 A1*  12/2015 Sander ............... G01R 19/0092
                                                  324/126

FOREIGN PATENT DOCUMENTS

JP   2007-285969 A   11/2007
JP   2009-038218 A    2/2009
JP   2014-239293 A   12/2014

OTHER PUBLICATIONS

International Search Report, Application No. PCT/JP2019/008780, dated May 28, 2019. ISA/Japan Patent Office.

* cited by examiner

*Primary Examiner* — Thienvu V Tran
*Assistant Examiner* — Carlos O Rivera-Perez
(74) *Attorney, Agent, or Firm* — Honigman LLP

(57) ABSTRACT

A control device includes a first series circuit and a second series circuit. In the first series circuit, a first switch and a first resistor are connected in series to each other. In the second series circuit, a second switch and a second resistor are connected in series to each other. A current detection circuit outputs a voltage value that corresponds to a voltage (Continued)

value between two ends of the first resistor. When an instruction to turn on the first switch and the second switch has been given, a control unit senses any occurrence of a failure in at least one of the first switch, the second switch, the first resistor, and the second resistor, based on the voltage value output by the current detection circuit.

9 Claims, 9 Drawing Sheets

(58) Field of Classification Search
CPC .... H03K 17/081–08148; H03K 17/082–0828; H03K 17/12–127; H02J 7/0013; H02J 7/0024; H02J 7/0026; H02J 7/0029; H02J 7/00304; H02J 7/0031; H02J 7/0032; H02J 7/0063; H02M 1/32; H02M 1/36; G01R 31/26–275
USPC ........ 323/222–226, 266, 271–278, 282–286, 323/351; 363/50–58; 361/54–57, 78, 79, 361/86, 87, 88–92, 93.1–102; 324/512, 324/522, 525, 531
See application file for complete search history.

FIG. 2

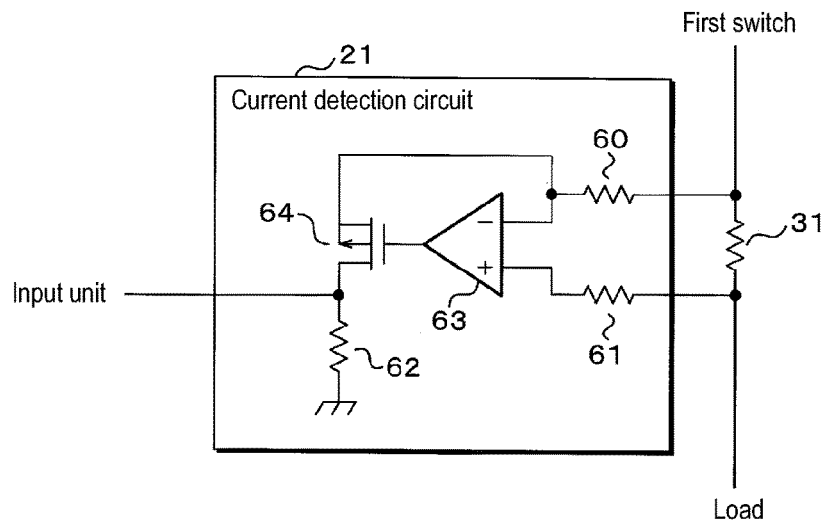

FIG. 3

| Part having failure | Details of failure | Resistance voltage value |
|---|---|---|
| First switch | Open failure | Less than lower-side threshold |
| Second switch | Open failure | Upper-side threshold or more |
| First resistor | Open failure | Upper-side threshold or more |
| | Short-circuit failure | Less than lower-side threshold |
| Second resistor | Open failure | Upper-side threshold or more |
| | Short-circuit failure | Less than lower-side threshold |

FIG. 6

| Part having failure | Details of failure | Resistance voltage value | First detection value | Second detection value |
|---|---|---|---|---|
| First switch | Open failure | Less than lower-side threshold | Less than Reference voltage value | Reference voltage value or more |
| Second switch | Open failure | Upper-side threshold or more | Reference voltage value or more | Less than Reference voltage value |
| First resistor | Open failure | Upper-side threshold or more | Reference voltage value or more | |
| First resistor | Short-circuit failure | Less than lower-side threshold | Reference voltage value or more | |
| Second resistor | Open failure | Upper-side threshold or more | | Reference voltage value or more |
| Second resistor | Short-circuit failure | Less than lower-side threshold | | Reference voltage value or more |

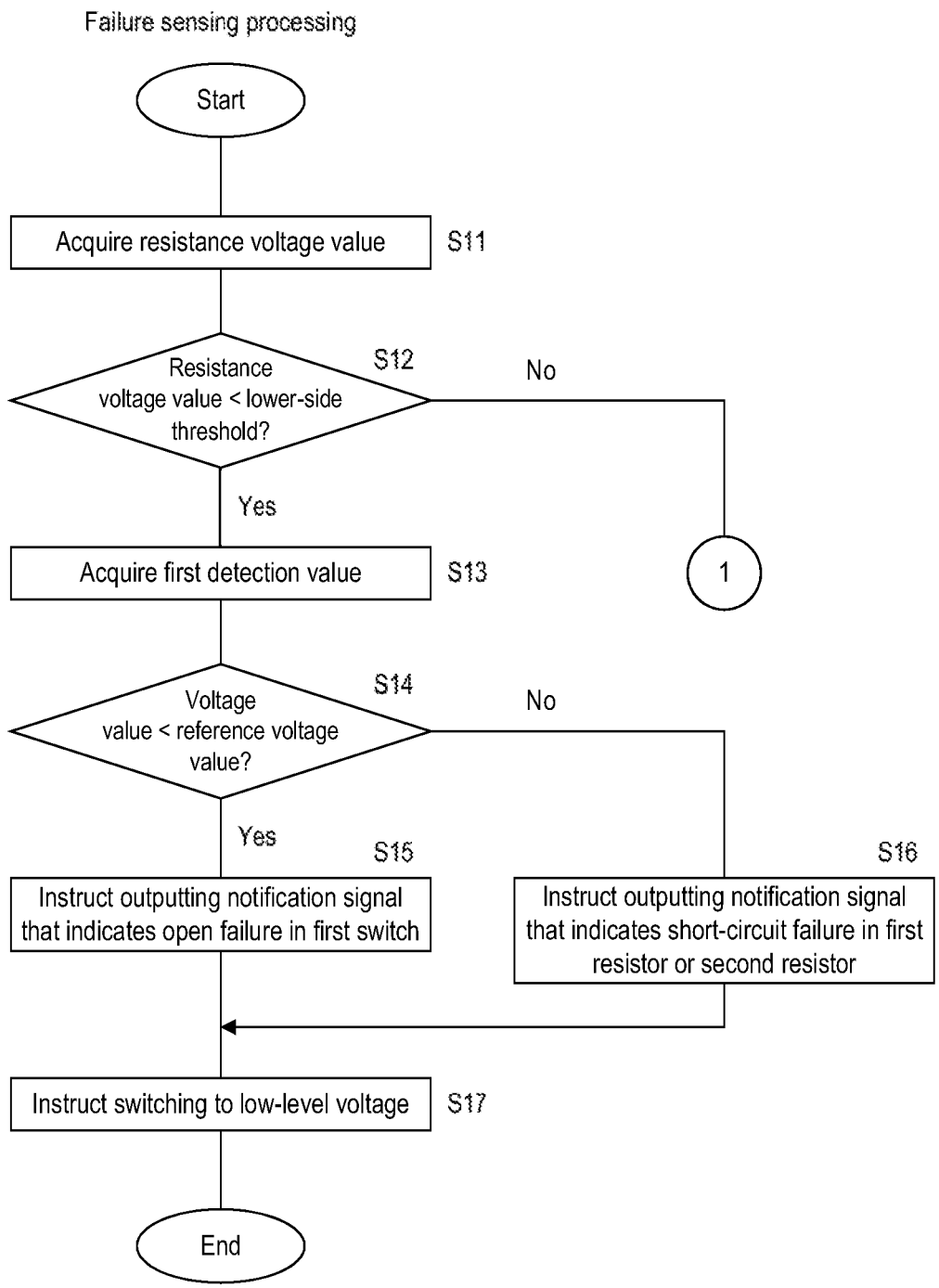

CONTROL DEVICE, CONTROL METHOD, AND COMPUTER PROGRAM

CROSS-REFERENCE TO RELATED APPLICATIONS

This application is the U.S. national stage of PCT/JP2019/008780 filed on Mar. 6, 2019, which claims priority of Japanese Patent Application No. JP 2018-056897 filed on Mar. 23, 2018, the contents of which are incorporated herein.

TECHNICAL FIELD

The present disclosure relates to a control device, a control method, and a computer program.

BACKGROUND

JP 2014-239293A discloses a control device of a vehicle that controls power feeding from a battery to a load. This control device includes two semiconductor switches whose ends on one side are connected to the positive electrode of the battery. The other ends of the two semiconductor switches are connected to one end of the load. A negative electrode of the battery and the other end of the load are grounded.

The two semiconductor switches are turned on or off. When the two semiconductor switches are on, electric power is fed from the battery to the load. When the two semiconductor switches are off, the power feeding from the battery to the load is stopped.

In JP 2014-239293A, a case is assumed in which one of the two semiconductor switches has a failure and is fixed to off. In this case, if the other one of the semiconductor switches is turned on, a large electric current will flow through the other semiconductor switch. When the large electric current flows through the other semiconductor switch, the other semiconductor switch consumes a large amount of electric power. Accordingly, the temperature of the other semiconductor switch may increase to an abnormal temperature, and a failure may also occur in the other semiconductor switch.

Therefore, it is an object of the present disclosure to provide a control device, a control method, and a computer program that can sense, when a switch is fixed to off, the occurrence of a failure.

SUMMARY

According to an aspect of the present disclosure, a control device includes a first series circuit that includes a first switch and a first resistor connected in series to each other; a second series circuit that includes a second switch and a second resistor connected in series to each other, and is connected in parallel to the first series circuit; an instruction unit configured to give an instruction to turn on the first switch and the second switch; a voltage output circuit configured to output a voltage value that corresponds to a voltage value between two ends of the first resistor; and a sensing unit configured to sense, when the instruction unit has given an instruction to turn on the first switch and the second switch, any occurrence of a failure in at least one of the first switch, the second switch, the first resistor, and the second resistor based on the voltage value output by the voltage output circuit.

According to an aspect of the present disclosure, a control method includes the steps of giving an instruction to turn on a first switch connected in series to a first resistor, and a second switch connected in series to a second resistor; acquiring a voltage value that corresponds to a voltage value between two ends of the first resistor; and sensing, when an instruction to turn on the first switch and the second switch has been given, any occurrence of a failure in at least one of the first switch, the second switch, the first resistor, and the second resistor based on the acquired voltage value, wherein a first series circuit that includes the first switch and the first resistor is connected in parallel to a second series circuit that includes the second switch and the second resistor.

According to an aspect of the present disclosure, a computer program is used to cause a computer to execute the steps of giving an instruction to turn on a first switch connected in series to a first resistor, and a second switch connected in series to a second resistor; acquiring a voltage value that corresponds to a voltage value between two ends of the first resistor; and sensing, when an instruction to turn on the first switch and the second switch has been given, any occurrence of a failure in at least one of the first switch, the second switch, the first resistor, and the second resistor based on the acquired voltage value, wherein a first series circuit that includes the first switch and the first resistor is connected in parallel to a second series circuit that includes the second switch and the second resistor.

Note that the present disclosure can be realized not only as a control device that includes the above-described characteristic processing units, but also a control method that includes the above-described characteristic processing as steps, as well as a computer program for causing a computer to execute these steps. Also, the present disclosure can be realized as a semiconductor integrated circuit that realizes a part of, or the entirety of, the control device, or a power supply system that includes the control device.

Effects of Present Disclosure

According to the present disclosure, it is possible to sense, when a switch is fixed to off, the occurrence of a failure.

BRIEF DESCRIPTION OF DRAWINGS

FIG. 2 is a circuit diagram of a current detection circuit.

FIG. 3 illustrates phenomena that occur due to failures.

FIG. 6 illustrates phenomena that occur due to failures.

FIG. 7 is a flowchart of a procedure of failure sensing processing.

DETAILED DESCRIPTION OF PREFERRED EMBODIMENTS

Figure 1:
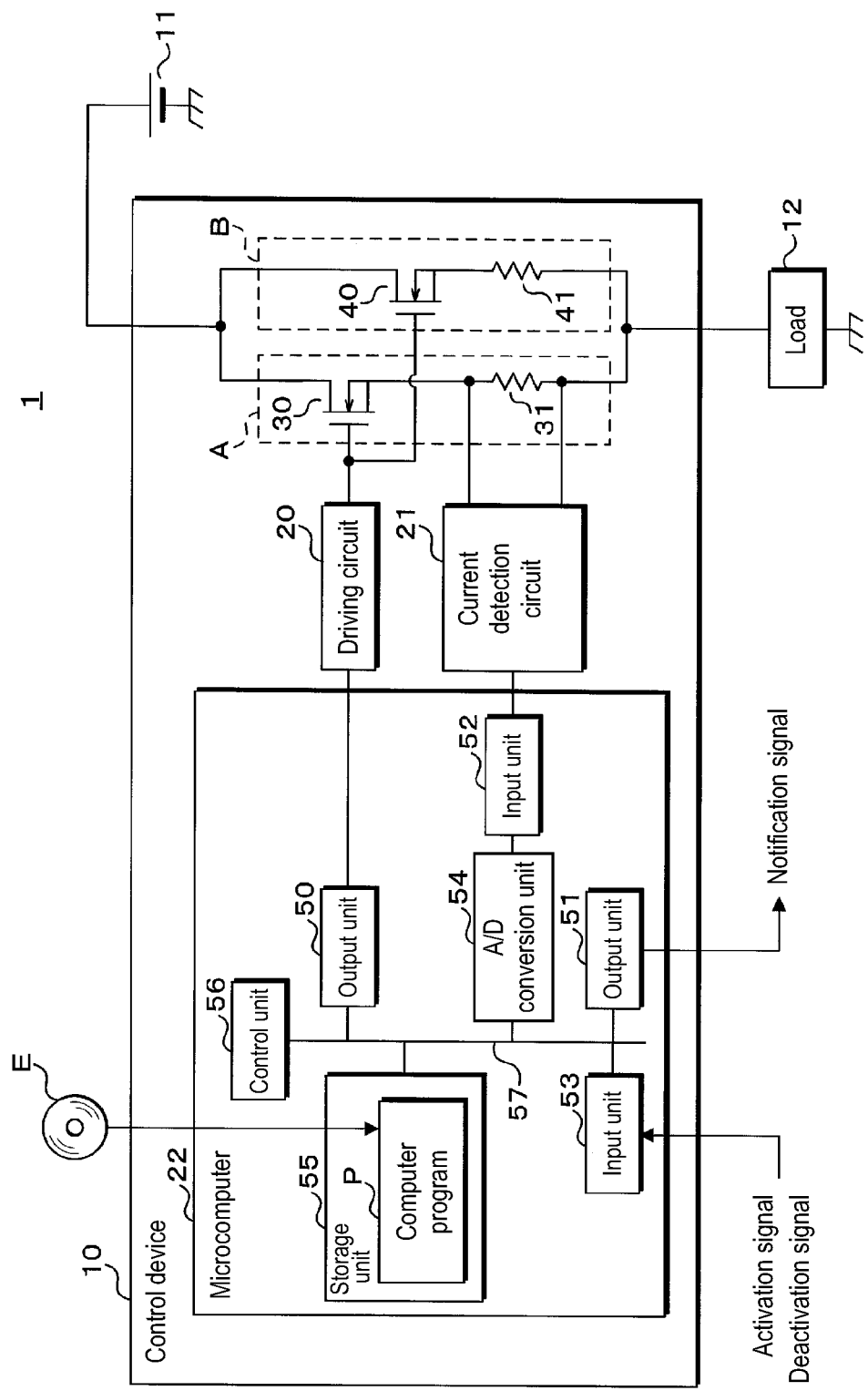
FIG. 1 is a block diagram illustrating a configuration of a main portion of a power supply system according to Embodiment 1.

First, aspects of implementation of the present disclosure will be listed and described. At least some of the following embodiments may also be combined as desired.

A control device according to one aspect of the present disclosure includes a first series circuit that includes a first switch and a first resistor connected in series to each other; a second series circuit that includes a second switch and a second resistor connected in series to each other, and is connected in parallel to the first series circuit; an instruction unit configured to give an instruction to turn on the first switch and the second switch; a voltage output circuit configured to output a voltage value that corresponds to a voltage value between two ends of the first resistor; and a sensing unit configured to sense, when the instruction unit has given an instruction to turn on the first switch and the second switch, any occurrence of a failure in at least one of the first switch, the second switch, the first resistor, and the second resistor based on the voltage value output by the voltage output circuit.

In the control device according to the one aspect of the present disclosure, the voltage value that is output by the voltage output circuit increases with an increase in the voltage value between the two ends of the first resistor, if the voltage value output by the voltage output circuit is less than a first threshold, the sensing unit senses that a failure has occurred in at least one of the first switch, the first resistor, and the second resistor, and if the voltage value output by the voltage output circuit is equal to or greater than a second threshold, the sensing unit senses that a failure has occurred in at least one of the second switch, the first resistor, and the second resistor, and the first threshold is less than the second threshold.

The control device according to the one aspect of the present disclosure further includes a voltage detection circuit configured to detect a voltage value of a connection node between the first switch and the first resistor, wherein, when having sensed that a failure has occurred in at least one of the first switch, the first resistor, and the second resistor, the sensing unit senses any occurrence of the failure in the first switch based on the voltage value detected by the voltage detection circuit.

The control device according to the one aspect of the present disclosure further includes a second voltage detection circuit configured to detect a voltage value of a connection node between the second switch and the second resistor, wherein, when having sensed that a failure has occurred in at least one of the second switch, the first resistor, and the second resistor, the sensing unit senses any occurrence of the failure in the second switch based on the voltage value detected by the second voltage detection circuit.

In the control device according to the one aspect of the present disclosure, an electric current flows through the first switch and the first resistor in this order, the voltage output circuit includes: a current output unit configured to draw the electric current from a connection node between the first switch and the first resistor, and output the drawn electric current; and a current resistor through which the electric current output by the current output unit flows, and the voltage output circuit outputs a voltage value between two ends of the current resistor.

A control method according to one aspect of the present disclosure includes the steps of giving an instruction to turn on a first switch connected in series to a first resistor, and a second switch connected in series to a second resistor; acquiring a voltage value that corresponds to a voltage value between two ends of the first resistor; and sensing, when an instruction to turn on the first switch and the second switch has been given, any occurrence of a failure in at least one of the first switch, the second switch, the first resistor, and the second resistor based on the acquired voltage value, wherein a first series circuit that includes the first switch and the first resistor is connected in parallel to a second series circuit that includes the second switch and the second resistor.

A computer program according to one aspect of the present disclosure is used to cause a computer to execute the steps of giving an instruction to turn on a first switch connected in series to a first resistor, and a second switch connected in series to a second resistor; acquiring a voltage value that corresponds to a voltage value between two ends of the first resistor; and sensing, when an instruction to turn on the first switch and the second switch has been given, any occurrence of a failure in at least one of the first switch, the second switch, the first resistor, and the second resistor based on the acquired voltage value, wherein a first series circuit that includes the first switch and the first resistor is connected in parallel to a second series circuit that includes the second switch and the second resistor.

With the control device, the control method, and the computer program according to the above-described aspects, when the first switch is on, the voltage value between the two ends of the first resistor is equal to the voltage value between two ends of a parallel circuit that includes the first series circuit and the second series circuit. When an instruction to turn on the first switch and the second switch has been given, if the second switch is fixed to off, or the first resistor or the second resistor is open, the resistance value of the parallel circuit will be large, and the voltage value between the two ends of the first resistor will be large.

When an instruction to turn on the first switch and the second switch has been given, if the first switch is fixed to off, or the first resistor or the second resistor is short, the voltage value between the two ends of the first resistor will be 0 V. The voltage output circuit outputs the voltage value that corresponds to the voltage value between the two ends of the first resistor.

If the first switch or the second switch is fixed to off, the voltage value output by the voltage output unit will largely vary. Accordingly, a failure that has occurred in at least one of the first switch, the second switch, the first resistor, and the second resistor is sensed.

With the control device according to the above-described aspect, if the voltage value output by the voltage output unit is less than the first threshold, a failure that has occurred in at least one of the first switch, the first resistor, and the second resistor is sensed. If the voltage value output by the voltage output unit is equal to or greater than the second threshold, a failure that has occurred in at least one of the second switch, the first resistor, and the second resistor is sensed.

With the control device according to the above-described aspect, when a failure that has occurred in at least one of the first switch, the first resistor, and the second resistor has been sensed, any occurrence of the failure in the first switch is sensed based on the voltage value of a connection node between the first switch and the first resistor.

With the control device according to the above-described aspect, when a failure that has occurred in at least one of the second switch, the first resistor, and the second resistor has been sensed, any occurrence of the failure in the second switch is sensed based on the voltage value of a connection node between the second switch and the second resistor.

With the control device according to the above-described aspect, in the voltage output circuit, only when the first switch is on, an electric current flows through the current resistor, and electric power is consumed. As a result, the power consumption is low.

The following will describe specific examples of power supply systems according to the embodiments of the present disclosure with reference to the drawings. Note that the present disclosure is not limited to these examples, but is defined by the claims, and is intended to encompass all modifications within the meanings and scope that are equivalent to the claims.

Embodiment 1

FIG. 1 is a block diagram illustrating a configuration of a main portion of a power supply system 1 according to Embodiment 1. The power supply system 1 is suitably installed in a vehicle, and includes a control device 10, a battery 11, and a load 12. The control device 10 is connected to the positive electrode of the battery 11, and one end of the load 12. The negative electrode of the battery 11 and the other end of the load 12 are grounded.

The load 12 is an electric device installed in the vehicle. The load 12 is activated when electric power is fed to the load 12. The load 12 is deactivated when the power feeding to the load 12 is stopped.

An activation signal for giving an instruction to activate the load 12, and a deactivation signal for giving an instruction to deactivate the load 12 are input to the control device 10. Upon input of the activation signal, the control device 10 electrically connects the positive electrode of the battery 11 and the one end of the load 12. Accordingly, the battery 11 feeds electric power to the load 12 via the control device 10.

Upon input of the deactivation signal, the control device 10 interrupts the electrical connection between the battery 11 and the load 12. Accordingly, the power feeding from the battery 11 to the load 12 is stopped, and the load 12 is deactivated.

As described above, the control device 10 controls power feeding from the battery 11 to the load 12, by electrically connecting the battery 11 and the load 12 and interrupting the electrical connection.

Also, if a failure occurs in the control device 10, the control device 10 will sense the occurrence of the failure, and will output, to a not-shown device, a notification signal for giving a notification that the failure has occurred. Accordingly, in the vehicle, a lamp blinks on and off or a message is displayed for example, so that the driver of the vehicle is notified of the occurrence of the failure.

The control device 10 includes a driving circuit 20, a current detection circuit 21, a microcomputer 22, a first series circuit A and a second series circuit B. The microcomputer 22 includes output units 50 and 51, input units 52 and 53, an A/D conversion unit 54, a storage unit 55, and a control unit 56. The first series circuit A includes a first switch 30 and a first resistor 31. The second series circuit B includes a second switch 40 and a second resistor 41. The first switch 30 and the second switch 40 are N-channel Field Effect Transistors (FETs). As the first resistor 31, a resistive element, a resistor of a pattern (conductive film) formed on a substrate, or the like is used. Similarly, as the second resistor 41, a resistive element, a resistor of a pattern formed on a substrate, or the like is used.

The second series circuit B is connected in parallel to the first series circuit A. In the first series circuit A, the first switch 30 is connected in series to the first resistor 31. Specifically, the source of the first switch 30 is connected to one end of the first resistor 31. In the second series circuit B, the second switch 40 is connected in series to the second resistor 41. Specifically, the source of the second switch 40 is connected to one end of the second resistor 41. The drains of the first switch 30 and the second switch 40 are connected to the positive electrode of the battery 11. The other ends of the first resistor 31 and the second resistor 41 are connected to the one end of the load 12.

The gates of the first switch 30 and the second switch 40 are connected to an output terminal of the driving circuit 20. An input terminal of the driving circuit 20 is connected to the output unit 50 of the microcomputer 22. The two ends of the first resistor 31 are connected to the current detection circuit 21. The current detection circuit 21 is further connected to the input unit 52 of the microcomputer 22. In the microcomputer 22, the input unit 52 is further connected to the A/D conversion unit 54. The output units 50 and 51, the input unit 53, the A/D conversion unit 54, the storage unit 55, and the control unit 56 are connected to an internal bus 57.

In the first switch 30 and the second switch 40, if the voltage value at the gate relative to the potential at the source is equal to or greater than a predetermined ON threshold, a current can flow through the drain and the source. At this time, the first switch 30 and the second switch 40 are both on. Also, if the voltage at the gate relative to the potential at the source is less than a predetermined OFF threshold, no current will flow through the drain and the source. At this time, the first switch 30 and the second switch 40 are both off. For both the first switch 30 and the second switch 40, the ON threshold exceeds the OFF threshold.

The output unit 50 outputs a high-level voltage or a low-level voltage to the driving circuit 20. In accordance with an instruction from the control unit 56, the output unit 50 switches the voltage that is output to the driving circuit 20 to the high-level voltage or the low-level voltage. If the voltage input from the output unit 50 is switched from the low-level voltage to the high-level voltage, the driving circuit 20 will increase the voltage values at the gates of the first switch 30 and the second switch 40 relative to a ground potential.

Accordingly, in both the first switch 30 and the second switch 40, the voltage value at the gate relative to the potential at the source is equal to or greater than the ON threshold, and the first switch 30 and the second switch 40 are turned on. When the first switch 30 and the second switch 40 are turned on, the positive electrode of the battery 11 is electrically connected to the one end of the load 12, electric power is supplied from the battery 11 to the load 12, and the load 12 is activated.

At this time, in the first series circuit A, a current flows through the first switch 30 and the first resistor 31 in this order. In the second series circuit B, a current flows through the second switch 40 and the second resistor 41 in this order.

Note that the resistance values of the first resistor 31 and the second resistor 41 preferably match each other. In this case, the current values of the currents flowing through the first series circuit A and the second series circuit B substantially match each other, and the speeds of the deterioration of the first switch 30 and the second switch 40 substantially match each other. This prevents one of the first switch 30 and the second switch 40 from rapidly deteriorating.

If the voltage input from the output unit 50 is switched from the high-level voltage to the low-level voltage, the driving circuit 20 will decrease the voltage values at the gates of the first switch 30 and the second switch 40 relative to the ground potential. Accordingly, in both the first switch 30 and the second switch 40, the voltage value at the gate relative to the potential at the source is less than the OFF threshold, and the first switch 30 and the second switch 40 are turned off.

As described above, the driving circuit 20 adjusts the voltage values at the gates of the first switch 30 and the second switch 40 relative to the ground potential to turn the first switch 30 and the second switch 40 on or off.

When the first switch 30 and the second switch 40 are turned off, the electrical connection between the battery 11 and the load 12 is interrupted, and the load 12 is deactivated. At this time, no current flows through the first series circuit A and the second series circuit B.

In the following, it is assumed that, when the first switch 30 and the second switch 40 are on, the resistance value between the drain and the source of each of the switches is 0 Ohm. Also, it is assumed that, when the first switch 30 and the second switch 40 are off, the resistance value between the drain and the source of each of the switches is infinite.

The current detection circuit 21 outputs an analog voltage value that is in proportion to the voltage value between the two ends of the first resistor 31 to the input unit 52 of the microcomputer 22. Hereinafter, the voltage value that is output by the current detection circuit 21 is referred to as a "resistance voltage value".

FIG. 2 is a circuit diagram of the current detection circuit 21. The current detection circuit 21 includes circuit resistors 60, 61, and 62, a differential amplifier 63, and a P-channel FET 64. The differential amplifier 63 is a so-called operational amplifier, and has a plus terminal, a minus terminal, and an output terminal.

One end of the circuit resistor 60 is connected to one end, on the first switch 30 side, of the first resistor 31. One end of the circuit resistor 61 is connected to one end, on the load 12 side, of the first resistor 31. The other ends of the circuit resistors 60 and 61 are respectively connected to the plus terminal and the minus terminal of the differential amplifier 63. The other end of the circuit resistor 60 is also connected to the source of the FET 64. The output terminal of the differential amplifier 63 is connected to the gate of the FET 64. The drain of the FET 64 is connected to the input unit 52 of the microcomputer 22 and one end of the circuit resistor 62. The other end of the circuit resistor 62 is grounded.

The FET 64 functions as a variable resistor. In the FET 64, a current flows through the drain and the source. In the FET 64, the lower the voltage value at the gate relative to the potential at the source is, the lower the resistance value between the drain and the source is. When the first switch 30 is on, a current flows from the positive electrode of the battery 11 through the first switch 30, the circuit resistor 60, the FET 64, and the circuit resistor 62 in this order. The current value of the current flowing to the circuit resistor 62 is larger the lower the resistance value between the drain and the source of the FET 64 is. The voltage value between the two ends of the circuit resistor 62, serving as a resistance voltage value, is output to the input unit 52 of the microcomputer 22. The voltage value between the two ends of the circuit resistor 62 is larger the larger the current value of the current flowing through the circuit resistor 62 is.

As described above, in the current detection circuit 21, the FET 64 draws a current from a connection node between the first switch 30 and the first resistor 31, and outputs the drawn current. The current output by the FET 64 flows through the circuit resistor 62. The current detection circuit 21, the FET 64, and the circuit resistor 62 respectively function as a voltage output circuit, a current output unit, and a current resistor.

The differential amplifier 63 adjusts the voltage value at the gate of the FET 64 relative to the ground potential. The more the differential amplifier 63 reduces the voltage value at the gate of the FET 64 relative to the ground potential, the larger the voltage value between the two ends of the first resistor 31 is. In the FET 64, the voltage value at the gate relative to the potential at the source is also lower the lower the voltage value at the gate relative to the ground potential is. As described above, in the FET 64, the lower the voltage value at the gate relative to the potential at the source is, the lower the resistance value between the drain and the source is.

In a case where the first switch 30 is on, if the voltage value between the two ends of the first resistor 31 increases, the differential amplifier 63 will decrease the voltage value at the gate of the FET 64. Accordingly, the resistance value between the drain and the source of the FET 64 decreases, and the current value of a current flowing through the circuit resistor 62 increases. As a result, the voltage value between the two ends of the circuit resistor 62 increases. In the same case, if the voltage value between the two ends of the first resistor 31 decreases, the differential amplifier 63 will increase the voltage value at the gate of the FET 64. Accordingly, the resistance value between the drain and the source of the FET 64 increases, and the current value of a current flowing through the circuit resistor 62 decreases. As a result, the voltage value between the two ends of the circuit resistor 62 decreases.

The resistance values of the circuit resistors 60 and 62 are respectively denoted by r60 and r62. The voltage value between the two ends of the first resistor 31 is denoted by V31. The resistance voltage value, that is, the voltage value between the two ends of the circuit resistor 62 is denoted by V62. The resistance voltage value V62 is given by Formula (1) below. "·" denotes multiplication.

$$V62 = V31 \cdot r62/r60 \quad (1)$$

Accordingly, the resistance voltage value V62 is proportional to the voltage value V31 between the two ends of the proportion first resistor 31. If the voltage value V31 between the two ends of the proportion first resistor 31 increases, the resistance voltage value V62 will increase.

The current value of a current flowing to the load 12 is denoted by It. The combined resistance value of a parallel circuit constituted by the first series circuit A and the second series circuit B is denoted by rs. In this case, the voltage value V31 between the two ends of the first resistor 31 is given by Formula (2) below.

$$V31 = rs \cdot It \quad (2)$$

Based on Formulae (1) and (2), when the voltage value V31 is deleted, the current value It is given by Formula (3) below.

$$It = V62 \cdot r60/(rs \cdot r62) \quad (3)$$

If no current is flowing through the first resistor 31, or the two ends of the first resistor 31 are short-circuited, the voltage value V31 between the two ends of the first resistor 31 is 0 V. As given by Formula (1), when the voltage value V31 between the two ends of the first resistor 31 is 0 V, the resistance voltage value V62 is 0 V.

When the first switch 30 is off, no current flows through the first resistor 31 and the circuit resistor 62, and no electric power is consumed in the current detection circuit 21. In the current detection circuit 21, only when the first switch 30 is on, a current flows through the circuit resistor 62, and electric power is consumed. Therefore, the power consumption of the control device 10 is low.

An analog resistance voltage value is input from the current detection circuit 21 to the input unit 52 of the microcomputer 22. The input unit 52 outputs the input analog resistance voltage value to the A/D conversion unit 54. The A/D conversion unit 54 converts the analog resistance voltage value input from the input unit 52 into a digital resistance voltage value. The control unit 56 acquires the digital resistance voltage value from the A/D conversion unit 54.

In accordance with an instruction from the control unit 56, the output unit 51 outputs a notification signal to a not-shown device.

An activation signal and a deactivation signal are input to the input unit 53. Upon input of an activation signal or a deactivation signal, the input unit 53 notifies the control unit 56 of the input signal.

The storage unit 55 is a nonvolatile memory. In the storage unit 55, a computer program P is stored. The control unit 56 includes one or more Central Processing Units (CPUs). By executing the computer program P, the one or more CPUs included in the control unit 56 executes activation processing, deactivation processing, protection processing, and failure sensing processing. The activation processing is processing for activating the load 12. The deactivation processing is processing for deactivating the load 12. The protection processing is processing for protecting the load 12 from an over current. The failure sensing processing is processing for sensing any occurrence of a failure. The computer program P is used to cause the one or more CPUs included in the control unit 56 to execute the activation processing, the deactivation processing, the protection processing, and the failure sensing processing.

Note that the computer program P may also be stored in a storage medium E so as to be readable by the one or more CPUs included in the control unit 56. In this case, the computer program P1 read from the storage medium E by a not-shown reading device is stored in the storage unit 55. The storage medium E is an optical disk, a flexible disk, a magnetic disk, a magneto-optical disk, a semiconductor memory, or the like. The optical disk is a Compact Disc (CD)-Read Only Memory (ROM), a Digital Versatile Disc (DVD)-ROM, a Blu-ray (registered trademark) Disc (BD), or the like. The magnetic disk is, for example, a hard disk. Alternatively, the computer program P may also be downloaded from a not-shown external device connected to a not-shown communication network, and the downloaded computer program P may also be stored in the storage unit 55.

Upon input of the activation signal to the input unit 53, the control unit 56 executes the activation processing. In the activation processing, the control unit 56 instructs the output unit 50 to switch its output to the high-level voltage. Accordingly, the output unit 50 switches the voltage that is output to the driving circuit 20 to the high-level voltage, and the driving circuit 20 turns on the first switch 30 and the second switch 40. Therefore, instructing the output unit 50 to switch its output to the high-level voltage corresponds to instructing the driving circuit 20 to turn on the first switch 30 and the second switch 40. The control unit 56 functions as an instruction unit.

When the first switch 30 and the second switch 40 have been turned on, electric power is fed from the battery 11 to the load 12, and the load 12 is activated. After having instructed the output unit 50 to switch its output to the high-level voltage, the control unit 56 ends the activation processing.

Upon input of the deactivation signal to the input unit 53, the control unit 56 executes the deactivation processing. In the deactivation processing, the control unit 56 instructs the output unit 50 to switch its output to the low-level voltage. Accordingly, the output unit 50 switches the voltage that is output to the driving circuit 20 to the low-level voltage, and the driving circuit 20 turns off the first switch 30 and the second switch 40.

Therefore, instructing the output unit 50 to switch its output to the low-level voltage corresponds to instructing the driving circuit 20 to turn off the first switch 30 and the second switch 40. When the first switch 30 and the second switch 40 have been turned off, the power feeding from the battery 11 to the load 12 is stopped, and the load 12 is deactivated. After having instructed the output unit 50 to switch its output to the low-level voltage, the control unit 56 ends the deactivation processing.

When the control unit 56 has instructed the output unit 50 to switch its output to the high-level voltage, that is, when the control unit 56 has instructed the driving circuit 20 to turn on the first switch 30 and the second switch 40, the control unit 56 periodically executes protection processing. In the protection processing, the control unit 56 acquires a resistance voltage value from the A/D conversion unit 54, and calculates the current value of a current flowing to the load 12 by substituting the acquired resistance voltage value in Formula (3). The control unit 56 determines whether or not the calculated current value is equal to or greater than a predetermined current value.

If it is determined that the calculated current value is equal to or greater than the predetermined current value, the control unit 56 instructs the output unit 50 to switch its output to the low-level voltage. Accordingly, the output unit 50 switches the voltage that is output to the driving circuit 20 to the low-level voltage, and the driving circuit 20 turns off the first switch 30 and the second switch 40. As a result, an over current is prevented from flowing to the load 12. Then, the control unit 56 ends the protection processing. If it is determined that the calculated current value is less than the predetermined current value, the control unit 56 also ends the protection processing.

When the control unit 56 has instructed the output unit 50 to switch its output to the high-level voltage, that is, when the control unit 56 has instructed the driving circuit 20 to turn on the first switch 30 and the second switch 40, the control unit 56 periodically executes failure sensing processing. In the failure sensing processing, the control unit 56 senses any occurrence of a failure in at least one of the first switch 30, the first resistor 31, the second switch 40, and the second resistor 41, based on a resistance voltage value output from the current detection circuit 21 to the input unit 52.

FIG. 3 illustrates phenomena that occur due to failures. Hereinafter, a failure in which a switch is fixed to off or two ends of a resistor are open is referred to as an "open failure". A failure in which two ends of a resistor are short-circuited is referred to as a "short-circuit failure". A lower-side threshold and an upper-side threshold are set as thresholds for a resistance voltage value. The lower-side threshold is less than the upper-side threshold, and exceeds zero.

As described above, the control unit 56 executes the failure sensing processing in a state in which the control unit 56 has instructed the driving circuit 20 to turn on the first switch 30 and the second switch 40. If an open failure occurs in the first switch 30, no current will flow through the first resistor 31. Accordingly, the voltage value between the two ends of the first resistor 31 is 0 V and the resistance voltage value is 0 V. Also, if a short-circuit failure occurs in the first resistor 31 or the second resistor 41, a current will flow from the battery 11 to the load 12. However, no voltage drop occurs between the two ends of the first resistor 31, and thus the voltage value between the two ends of the first resistor 31 is 0 V, and the resistance voltage value is 0 V.

As described above, if an open failure occurs in the first switch 30, or a short-circuit failure occurs in the first resistor 31 or the second resistor 41, the resistance voltage value is 0 V, and is less than the lower-side threshold.

The value of a voltage output by the battery 11 (hereinafter, referred to as a "battery voltage value") is denoted by "Vb". A combined resistance value of the parallel circuit in which the second resistor 41 is connected in parallel to the first resistor 31 is denoted by "rp". The resistance value of the load 12 is denoted by "r12". As described above, the control unit 56 has instructed the driving circuit 20 to turn on the first switch 30 and the second switch 40. Accordingly, the resistance value between the two ends of the first resistor 31 is typically equal to the combined resistance value of the parallel circuit in which the second resistor 41 connected in parallel to the first resistor 31. In this case, the voltage value V31 between the two ends of the first resistor 31 is given by "Vb·rp/(rp+r12)".

The resistance value of the first resistor 31 is denoted by "r31". If an open failure occurs in the second switch 40 or the second resistor 41, the resistance value between the two ends of the first resistor 31 is equal to the resistance value r31 of the first resistor 31. In this case, the voltage value V31 between the two ends of the first resistor 31 is given by "Vb·r31/(r12+r31)". The resistance value r31 exceeds the resistance value rp. Accordingly, "Vb·r31/(r12+r31) exceeds "Vb·rp/(rp+r12)".

The resistance value of the second resistor 41 is denoted by "r41". If an open failure occurs in the first resistor 31, the resistance value between the two ends of the first resistor 31 is equal to the resistance value r41 of the second resistor 41. In this case, the voltage value V31 between the two ends of the first resistor 31 is given by "Vb·r41/(r12+r41)". The resistance value r41 exceeds the resistance value rp. Accordingly, "Vb·r41/(r12+r41) exceeds "Vb·rp/(rp+r12)".

The resistance voltage value V62 is proportional to the voltage value V31 between the two ends of the first resistor 31, as given by Formula (1).

The upper-side threshold is equal to or less than the lower one of the resistance voltage values when open failures haves occurred in the first resistor 31 and the second resistor 41, and is set to a voltage value higher than a resistance voltage value in a normal state. Therefore, if an open failure occurs in the second switch 40, the first resistor 31, or the second resistor 41, the resistance voltage value is equal to or greater than the upper-side threshold.

Figure 4:
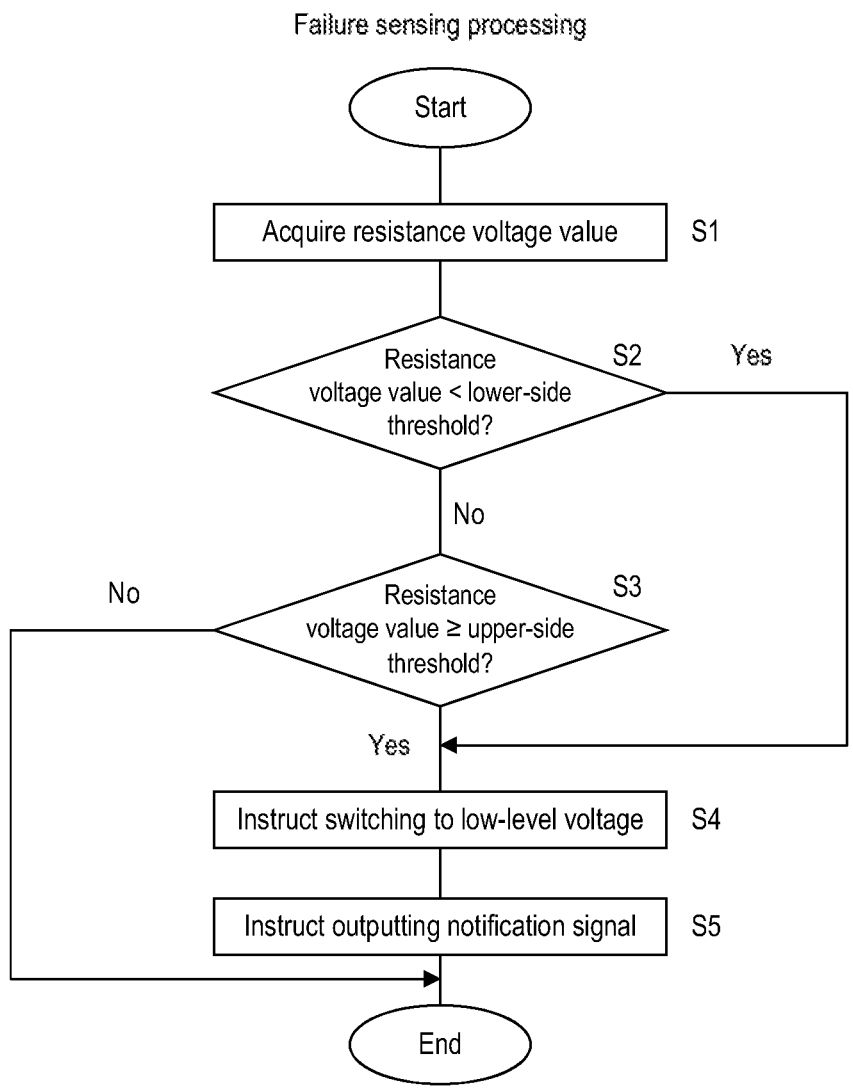
FIG. 4 is a flowchart illustrating a procedure of failure sensing processing.

FIG. 4 is a flowchart illustrating a procedure of the failure sensing processing. As described above, the control unit 56 periodically executes the failure sensing processing when having instructed the driving circuit 20 to perform turning-on.

In the failure sensing processing, first, the control unit 56 acquires a resistance voltage value from the A/D conversion unit 54 (step S1), and determines whether or not the acquired resistance voltage value is less than a lower-side threshold (step S2). As described above, if the resistance voltage value is less than the lower-side threshold, this means that a failure has occurred in at least one of the first switch 30, the first resistor 31, and the second resistor 41. Accordingly, determining that the resistance voltage value is less than a lower-side threshold corresponds to sensing that a failure has occurred in at least one of the first switch 30, the first resistor 31, and the second resistor 41. The lower-side threshold corresponds to a first threshold. The control unit 56 also functions as a sensing unit.

If it is determined that the resistance voltage value is equal to or greater than the lower-side threshold (NO in step S2), the control unit 56 determines whether or not the resistance voltage value acquired in step S1 is equal to or greater than the upper-side threshold (step S3). As described above, if the resistance voltage value is equal to or greater than the upper-side threshold, this means that a failure has occurred in at least one of the second switch 40, the first resistor 31, and the second resistor 41. Accordingly, determining that the resistance voltage value is equal to or greater than an upper-side threshold corresponds to sensing that a failure has occurred in at least one of the second switch 40, the first resistor 31, and the second resistor 41. The upper-side threshold corresponds to a second threshold.

If it is determined that the resistance voltage value is less than the lower-side threshold (YES in step S2), or if it is determined that the resistance voltage value is equal to or greater than the upper-side threshold (YES in step S3), the control unit 56 instructs the output unit 50 to switch its output to the low-level voltage (step S4). In response thereto, the output unit 50 switches the voltage that is output to the driving circuit 20 to the low-level voltage, and the driving circuit 20 turns off the first switch 30 and the second switch 40. Accordingly, no large current will flow through the first switch 30 or the second switch 40, and the temperature of the first switch 30 or the second switch 40 does not increase to an abnormal temperature.

Then, the control unit 56 instructs the output unit 51 to output a notification signal (step S5). In response thereto, the output unit 51 outputs the notification signal, and a notification that the failure has occurred is given. If it is determined that the resistance voltage value is less than the upper-side threshold (NO in step S3), or after step S5 has been executed, the control unit 56 ends the failure sensing processing.

As described above, in the control device 10, if an open failure occurs in the first switch 30, the resistance voltage value will be less than the lower-side threshold, and if an open failure occurs in the second switch 40, the resistance voltage value will be equal to or greater than the upper-side threshold. Therefore, if an open failure occurs in the first switch 30 or the second switch 40, the control unit 56 will sense that the failure has occurred in at least one of the first switch 30, the second switch 40, the first resistor 31, and the second resistor 41.

Note that, in the current detection circuit 21, the FET 64 may also be of an N-channel type. In this case, the plus terminal and the minus terminal of the differential amplifier 63 are respectively connected to the other ends of the circuit resistors 60 and 61. Furthermore, the drain of the FET 64 is connected to the other end of the circuit resistor 60, and the source of the FET 64 is connected to one end of the circuit resistor 62. In this case, the differential amplifier 63 adjusts the voltage value at the gate of the FET 64 to a higher voltage value the larger the voltage value between the two ends of the first resistor 31 is. The resistance value between the drain and the source of the FET 64 is smaller the larger the voltage value at the gate is.

Furthermore, the FET 64 only needs to function as a variable resistor. Accordingly, instead of the FET 64, a bipolar transistor may also be used. A P-channel FET corresponds to a PNP-type bipolar transistor. The N-channel FET corresponds to an NPN-type bipolar transistor.

Furthermore, the current detection circuit 21 is not limited to a circuit that draws a current from one end, on the first switch 30 side, of the first resistor 31, and may also be a circuit that output a voltage value that corresponds to the voltage value between the two ends of the first resistor 31.

Embodiment 2

Figure 5:
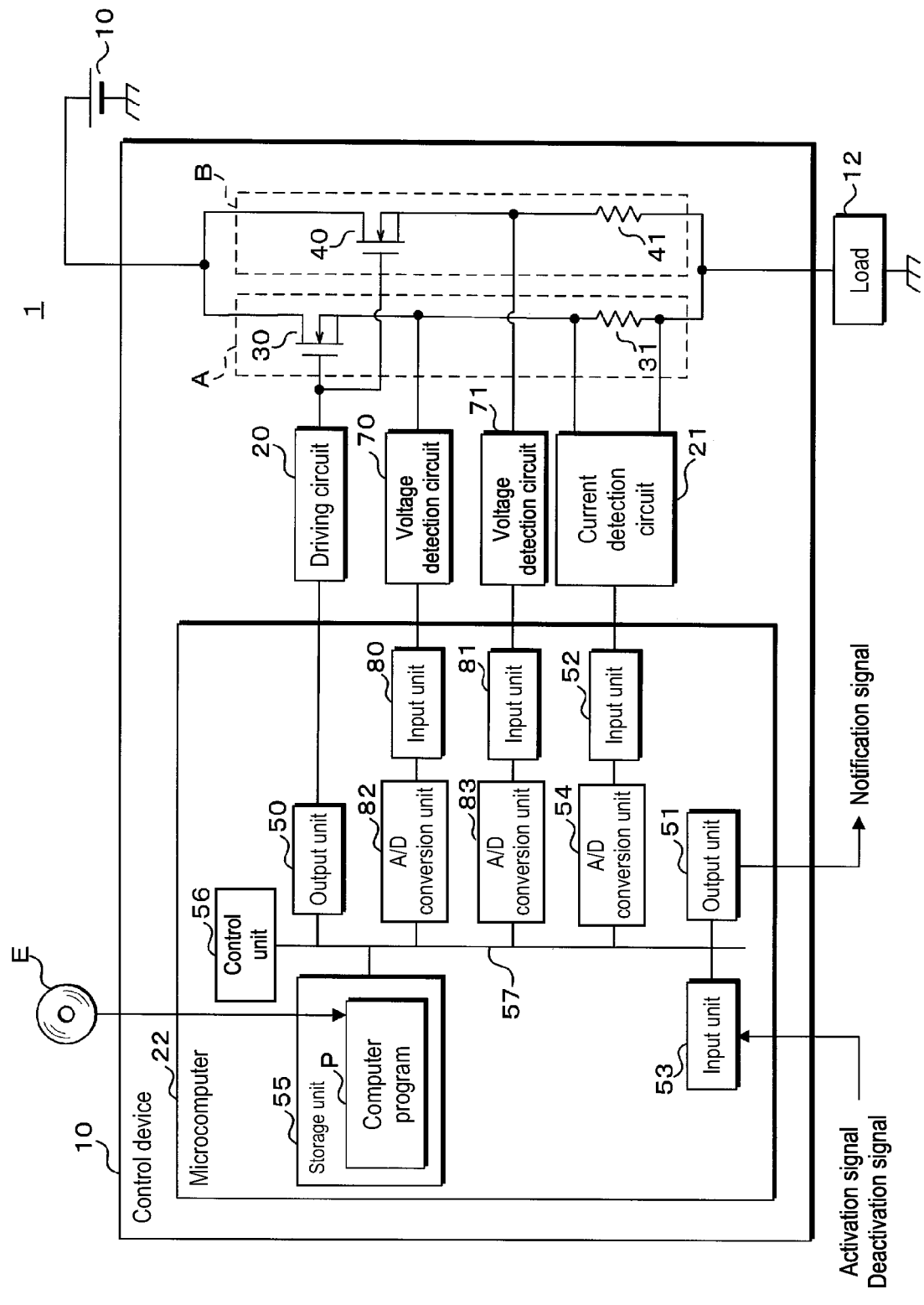
FIG. 5 is a block diagram illustrating a configuration of a main portion of a power supply system according to Embodiment 2.

FIG. 5 is a block diagram illustrating a configuration of a main portion of a power supply system 1 according to Embodiment 2.

The following will describe Embodiment 2 focusing on the differences from Embodiment 1. Configurations other than the following configurations are the same as those in Embodiment 1, and thus the constituent units that are the same as those in Embodiment 1 are denoted using the same reference numerals as those used in Embodiment 1 and descriptions thereof are omitted.

When compared to Embodiment 1, Embodiment 2 includes a control device 10 that has a different configuration. The control device 10 of Embodiment 2 includes, in addition to the constituent units of the control device 10 of Embodiment 1, voltage detection circuits 70 and 71. The microcomputer 22 of Embodiment 2 includes, in addition to the constituent units of the microcomputer 22 according to Embodiment 1, input units 80 and 81, and A/D conversion units 82 and 83.

The voltage detection circuit 70 is connected to a connection node between the first switch 30 and the first resistor 31, and to the input unit 80 of the microcomputer 22. The input unit 80 is further connected to the A/D conversion unit 82. The A/D conversion unit 82 is further connected to the internal bus 57. The voltage detection circuit 71 is connected to a connection node between the second switch 40 and the second resistor 41, and to the input unit 81 of the microcomputer 22. The input unit 81 is further connected to the A/D conversion unit 83. The A/D conversion unit 83 is further connected to the internal bus 57.

The voltage detection circuit 70 detects the voltage value of the connection node between the first switch 30 and the first resistor 31. The voltage value is a voltage value relative to the ground potential. The voltage detection circuit 70 outputs an analog first detection value indicating the detected voltage value to the input unit 80.

Upon input of the analog first detection value from the voltage detection circuit 70, the input unit 80 outputs the input analog first detection value to the A/D conversion unit 82. The A/D conversion unit 82 converts the analog first detection value input from the input unit 80 into a digital first detection value. The control unit 56 acquires the digital first detection value from the A/D conversion unit 82.

The voltage detection circuit 71 detects the voltage value of the connection node between the second switch 40 and the second resistor 41. The voltage value is a voltage value relative to the ground potential. The voltage detection circuit 71 outputs an analog second detection value indicating the detected voltage value to the input unit 80. The voltage detection circuit 71 functions as a second voltage detection circuit.

Upon input of the analog second detection value from the voltage detection circuit 71, the input unit 80 outputs the input analog second detection value to the A/D conversion unit 83. The A/D conversion unit 83 converts the analog second detection value input from the input unit 81 into a digital second detection value. The control unit 56 acquires the digital second detection value from the A/D conversion unit 83.

Similar to Embodiment 1, the control unit 56 executes activation processing, deactivation processing, protection processing, and failure sensing processing by executing the computer program P. The activation processing, the deactivation processing, and the protection processing of Embodiment 2 are the same as the activation processing, the deactivation processing, and the protection processing of Embodiment 1, respectively. The failure sensing processing of Embodiment 2 differs from the failure sensing processing of Embodiment 1.

FIG. 6 illustrates phenomena that occur due to failures. As mentioned in the description of Embodiment 1, if an open failure occurs in the first switch 30, or a short-circuit failure occurs in the first resistor 31 or the second resistor 41, the resistance voltage value will be less than the lower-side threshold.

If an open failure occurs in the first switch 30, the voltage value detected by the voltage detection circuit 70, that is, the voltage value indicated by the first detection value is equal to a voltage value (hereinafter, referred to as a load voltage value) of a voltage applied to the two ends of the load 12. The voltage value is lower than the battery voltage value. If a short-circuit failure occurs in the first resistor 31 or the second resistor 41, the voltage value indicated by the first detection value is equal to the battery voltage value.

As mentioned in the description of Embodiment 1, if an open failure occurs in the second switch 40, the first resistor 31, or the second resistor 41, the resistance voltage value will be equal to or greater than the upper-side threshold. If an open failure occurs in the second switch 40, the voltage value detected by the voltage detection circuit 71, that is, the voltage value indicated by the second detection value is equal to the load voltage value. The voltage value is lower than the battery voltage value. If an open failure occurs in the first resistor 31 or the second resistor 41, the voltage value indicated by the second detection value is equal to the battery voltage value.

A predetermined reference voltage value is set in advance. The reference voltage value is higher than the load voltage value when an open failure has occurred in the first switch 30, and the load voltage value when an open failure has occurred in the second switch 40. Also, the reference voltage value is equal to or less than the battery voltage value.

Accordingly, in a case where the resistance voltage value is less than the lower-side threshold, that is, where a failure has occurred in at least one of the first switch 30, the first resistor 31, and the second resistor 41, if an open failure has occurred in the first switch 30, the voltage value indicated by the first detection value is less than the reference voltage value. Also, in a case where the resistance voltage value is equal to or greater than the upper-side threshold, that is, where a failure has occurred in at least one of the second switch 40, the first resistor 31, and the second resistor 41, if an open failure has occurred in the second switch 40, the voltage value indicated by the second detection value is less than the reference voltage value.

Figure 8:
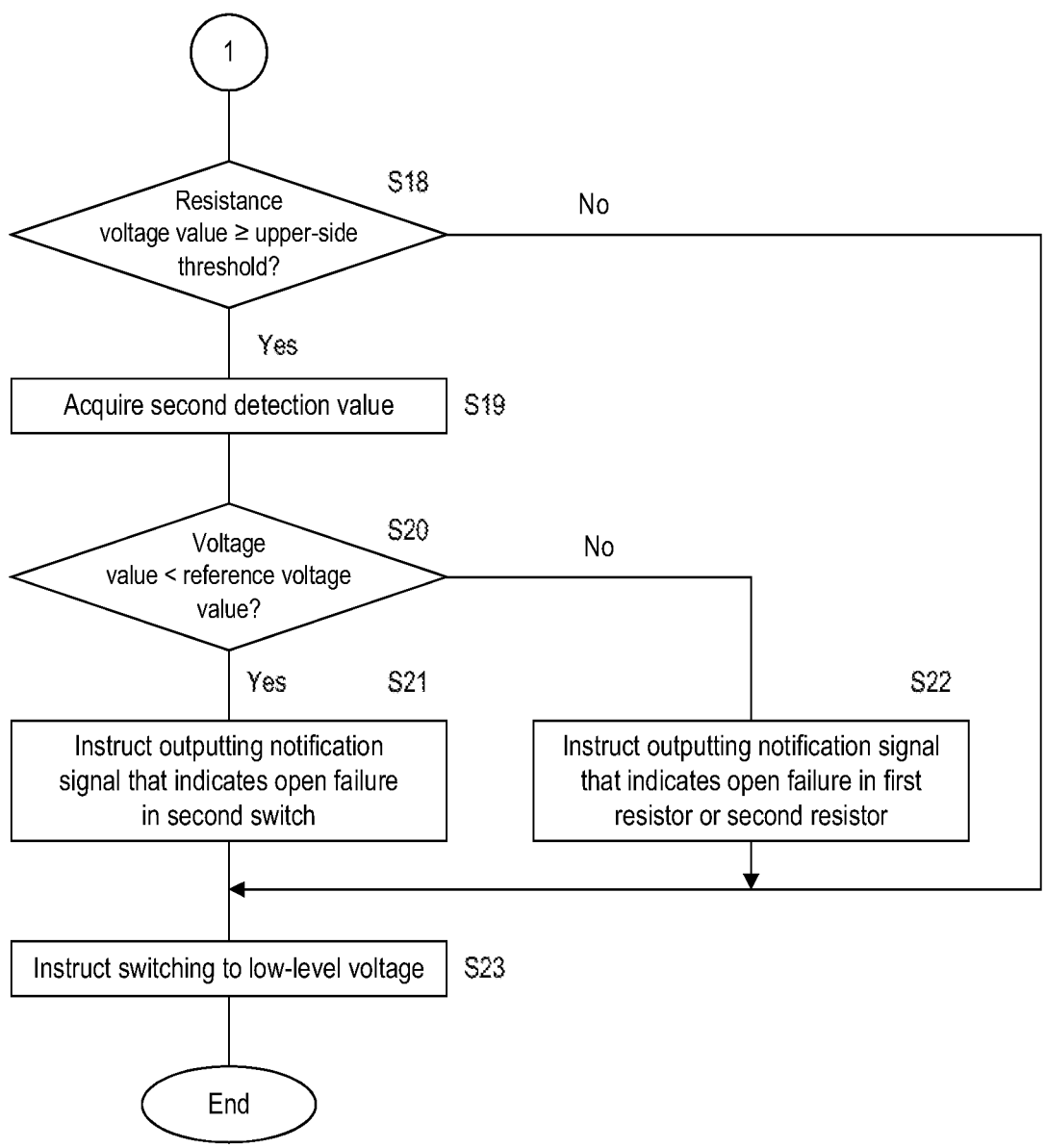
FIG. 8 is the flowchart of the procedure of the failure sensing processing.

FIGS. 7 and 8 are a flowchart illustrating a procedure of the failure sensing processing. Similar to Embodiment 1, the control unit 56 periodically executes the failure sensing processing when having instructed the driving circuit 20 to perform turning-on. Steps S11, S12, and S18 of the failure sensing processing according to Embodiment 2 are the same as steps S1, S2, and S3 of the failure sensing processing according to Embodiment 1, respectively. Steps S17 and S23 of the failure sensing processing according to Embodiment 2 are the same as step S4 of the failure sensing processing according to Embodiment 1. Accordingly, detailed descriptions of steps S11, S12, S17, S18, and S23 are omitted.

If it is determined that the resistance voltage value acquired in step S11 is less than the lower-side threshold (YES in step S12), the control unit 56 acquires the first detection value from the A/D conversion unit 82 (step S13). Then, the control unit 56 determines whether or not the voltage value indicated by the first detection value acquired in step S13 is less than the reference voltage value (step S14).

As described above, when the resistance voltage value is less than the lower-side threshold, and when the voltage value indicated by the first detection value is less than the reference voltage value, an open failure has occurred in the first switch 30. Accordingly, determining that the voltage value indicated by the first detection value acquired in step S13 is less than the reference voltage value corresponds to sensing that a failure has occurred in the first switch 30. The control unit 56 senses that an open failure has occurred in the first switch 30 based on the voltage value of the connection node between the first switch 30 and the first resistor 31.

If it is determined that the voltage value is less than the reference voltage value (YES in step S14), the control unit 56 instructs the output unit 51 to output a notification signal indicating that the open failure has occurred in the first switch 30 (step S15). In response thereto, the output unit 51 outputs the notification signal, and a notification that the open failure has occurred in the first switch 30 is given.

If it is determined that the voltage value is equal to or greater than the reference voltage value (NO in step S14), the control unit 56 instructs the output unit 51 to output a notification signal indicating that a short-circuit failure has occurred in the first resistor 31 or the second resistor 41 (step S16). In response thereto, the output unit 51 outputs the notification signal, and a notification that the short-circuit failure has occurred in the first resistor 31 or the second resistor 41 is given. After having executed one of steps S15 and S16, the control unit 56 executes step S17, and ends the failure sensing processing.

If it is determined that resistance voltage value acquired in step S11 is equal to or greater than the lower-side threshold (NO in step S12), the control unit 56 executes step S18. Then, if it is determined that the resistance voltage value acquired in step S11 is equal to or greater than the upper-side threshold (YES in step S18), the control unit 56 acquires the second detection value from the A/D conversion unit 82 (step S19). The control unit 56 determines whether or not the voltage value indicated by the second detection value acquired in step S19 is less than the reference voltage value (step S20).

As described above, when the resistance voltage value is equal to or greater than the upper-side threshold, and when the voltage value indicated by the second detection value is less than the reference voltage value, an open failure has occurred in the second switch 40. Accordingly, determining that the voltage value indicated by the second detection value in step S20 is less than the reference voltage value corresponds to sensing that a failure has occurred in the second switch 40. The control unit 56 senses that an open failure has occurred in the second switch 40 based on the voltage value of the connection node between the second switch 40 and the second resistor 41.

If it is determined that the voltage value is less than the reference voltage value (YES in step S20), the control unit 56 instructs the output unit 51 to output a notification signal indicating that an open failure has occurred in the second switch 40 (step S21). In response thereto, the output unit 51 outputs the notification signal, and a notification that the open failure has occurred in the second switch 40 is given.

If it is determined that the voltage value is equal to or greater than the reference voltage value (NO in step S20), the control unit 56 instructs the output unit 51 to output a notification signal indicating that an open failure has occurred in the first resistor 31 or the second resistor 41 (step S22). In response thereto, the output unit 51 outputs the notification signal, and a notification that the open failure has occurred in the first resistor 31 or the second resistor 41 is given. If it is determined that the resistance voltage value acquired in step S11 is less than the upper-side threshold (NO in step S18), or after one of steps S21 and S22 has executed, the control unit 56 executes step S23, and ends the failure sensing processing.

The control device 10 of Embodiment 2 achieves the same effects as those achieved by the control device 10 of Embodiment 1.

Note that, in Embodiment 2, the control unit 56 of the control device 10 can sense any occurrence of a short-circuit failure in at least one of the first switch 30 and the second switch 40. Here, a short-circuit failure is a failure in which a switch is fixed to on. In a state in which the control unit 56 has instructed the driving circuit 20 to turn off the first switch 30 and the second switch 40, the control unit 56 senses any occurrence of a short-circuit failure in at least one of the first switch 30 and the second switch 40, based on the voltage values indicated by the first detection value and the second detection value acquired from the A/D conversion units 82 and 83, that is, the voltage values detected by the voltage detection circuits 70 and 71. Specifically, when the control unit 56 has instructed the driving circuit 20 to turn off the first switch 30 and the second switch 40, and when the voltage values indicated by the first detection value and the second detection value exceed 0 V, the control unit 56 senses that a short-circuit failure has occurred in at least one of the first switch 30 and the second switch 40. The switch in which a short-circuit failure has occurred is the switch that corresponds to one of the first detection value and the second detection value that indicates the same voltage value as the battery voltage value.

Embodiment 3

Figure 9:
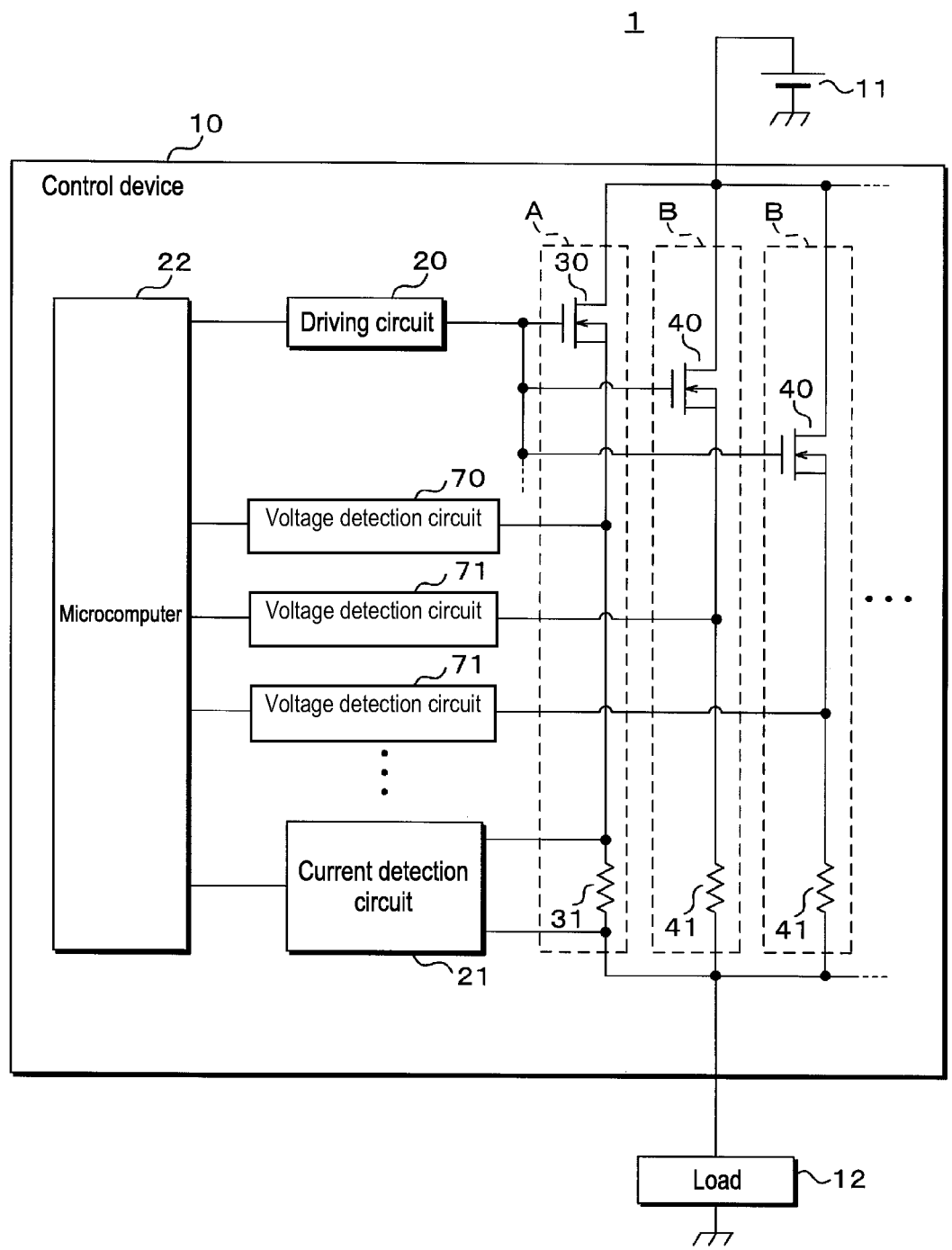
FIG. 9 is a block diagram illustrating a configuration of a main portion of a power supply system according to Embodiment 3.

FIG. 9 is a block diagram illustrating a configuration of a main portion of a power supply system 1 according to Embodiment 3.

The following will describe Embodiment 3 focusing on the differences from Embodiment 2. Configurations other than the following configurations are the same as those in Embodiment 2, and thus the constituent units that are the same as those in Embodiment 2 are denoted using the same reference numerals as those used in Embodiment 2 and descriptions thereof are omitted.

When compared to Embodiment 2, Embodiment 3 includes a control device 10 that has a different configuration. Similar to Embodiment 2, the control device 10 of Embodiment 3 includes a driving circuit 20, a current detection circuit 21, a microcomputer 22, a voltage detection circuit 70, and a first series circuit A. The control device 10 of Embodiment 3 further includes N second series circuits B, and N voltage detection circuits 71. N is an integer of 2 or more.

In each of the second series circuits B, a second switch 40 and a second resistor 41 are connected to each other in the same manner as in Embodiment 2. Accordingly, the drain of each second switch 40 is connected to the positive electrode of the battery 11. The source of each second switch 40 is connected to one end of the second resistor 41. The other end of the second resistor 41 is connected to one end of the load 12. The gate of the second switch 40 is connected to the output terminal of the driving circuit 20.

In each of the second series circuits B, a connection node between the second switch 40 and the second resistor 41 is connected to the voltage detection circuit 71. The N voltage detection circuits 71 are connected to the microcomputer 22.

Figure 10:
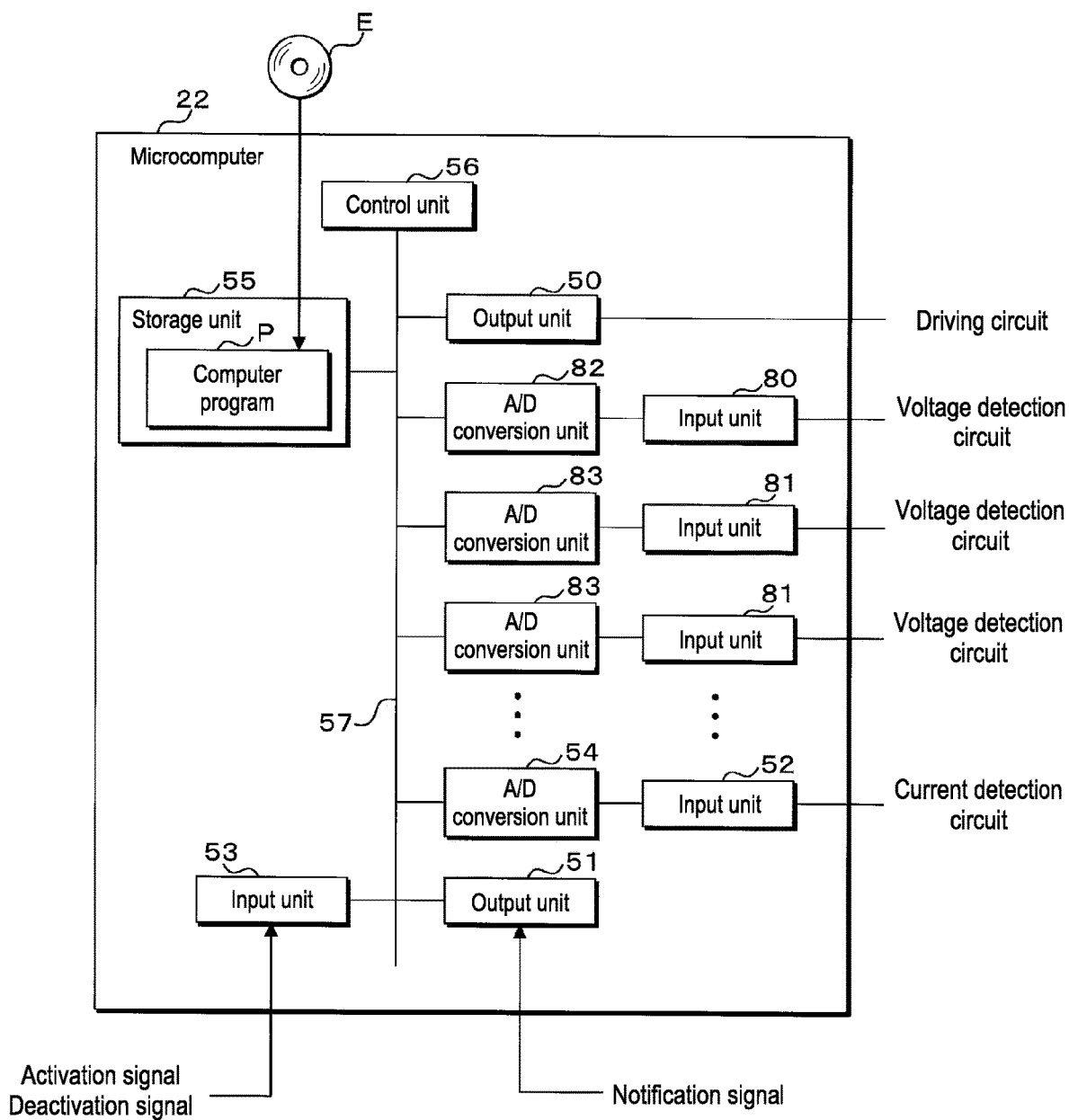
FIG. 10 is a block diagram illustrating a configuration of a main portion of a microcomputer.

FIG. 10 is a block diagram illustrating a configuration of a main portion of the microcomputer 22. Similar to Embodiment 2, the microcomputer 22 of Embodiment 3 includes output units 50 and 51, input units 52, 53, and 80, A/D conversion units 54 and 82, a storage unit 55, and a control unit 56. The microcomputer 22 of Embodiment 3 further includes N input units 81 and N A/D conversion units 83.

The N input units 81 are connected to the N voltage detection circuits 71. The N input units 81 are further connected to the N A/D conversion units 83. The N A/D conversion units 83 are further connected to the internal bus 57.

The voltage detection circuits 71, the input units 81, and the A/D conversion units 83 function in the same manner as those of Embodiment 2. Similar to Embodiment 2, the control unit 56 executes activation processing, deactivation processing, protection processing, and failure sensing processing.

The reference voltage value is higher than the load voltage value when an open failure has occurred in the first switch 30, and the load voltage value when an open failure has occurred in each of the N second switches 40. Also, the reference voltage value is equal to or less than the battery voltage value.

Each of the N second resistors 41 may also have a resistance value that is different from the resistance value of at least one of the other second resistors 41.

In step S19 of the failure sensing processing, the control unit 56 acquires N second detection values from the N A/D conversion units 83. In step S20 of the failure sensing processing, the control unit 56 determines whether or not at least one of N voltage values indicated by the N second detection values acquired in step S19 is less than the reference voltage value.

If it is determined that at least one of the N voltage values is less than the reference voltage value (YES in step S20), the control unit 56 executes step S21. In step S21, the control unit 56 instructs the output unit 51 to output a notification signal indicating that an open failure has occurred in one or more second switches 40 that correspond to the one or more voltage values that are less than the reference voltage value. In response thereto, a notification that the open failure has occurred in one or more second switches 40 is given.

If it is determined that none of the N voltage values is less than the reference voltage value, that is, all of the N voltage values are equal to or greater than the reference voltage value (NO in step S20), the control unit 56 executes step S22.

The control device 10 of Embodiment 3 achieves the same effects as those achieved by the control device 10 of Embodiment 2.

Note that, also in Embodiment 3, the control unit 56 of the control device 10 can sense any occurrence of a short-circuit failure in at least one of the first switch 30 and the N second switches 40. In a state in which the control unit 56 has instructed the driving circuit 20 to turn off the first switch 30 and the N second switches 40, the control unit 56 senses any occurrence of a short-circuit failure in at least one of the first switch 30 and the N second switches 40, based on the voltage values indicated by the first detection value and N second detection values acquired from the A/D conversion unit 82 and the N A/D conversion units 83. Specifically, when the control unit 56 has instructed the driving circuit 20 to turn off the first switch 30 and the N second switches 40, and when the voltage values indicated by the first detection value and the N second detection values exceed 0 V, the control unit 56 senses that a short-circuit failure has occurred in at least one of the first switch 30 and the N second switches 40. The switch in which a short-circuit failure has occurred is the switch that corresponds to one of the first detection value and the N second detection values that indicates the same voltage value as the battery voltage value.

Note that, in Embodiments 1 to 3, the first switch 30 and the second switches 40 are not limited to N-channel FETs, and may also be P-channel FETs, bipolar transistors, or the like.

Furthermore, the processing in which a calculated current value is used based on a resistance voltage value output by the current detection circuit 21 is not limited to the protection processing, and may also be, for example, processing for calculating, from the current value, the temperature of an electric wire connected between the battery 11 and the load 12.

Furthermore, it is sufficient that, in the first series circuit A, the first switch 30 and the first resistor 31 are connected in series to each other. Therefore, in addition to the first switch 30 and the first resistor 31, for example, an inductor may also be connected in series to them. Similarly, it is sufficient that, in the second series circuit B, the second switch 40 and the second resistor 41 are connected in series to each other. Therefore, in addition to the second switch 40 and the second resistor 41, an inductor may also be connected in series to them.

Disclosed Embodiments 1 to 3 are illustrative examples in all respects and should not be considered as restrictive. The scope of the present disclosure is defined not by the above descriptions but by the claims, and is intended to encompass all modifications within the meanings and scope that are equivalent to the claims.

The invention claimed is:

1. A control device comprising:
   a first series circuit that includes a first switch and a first resistor connected in series to each other;
   a second series circuit that includes a second switch and a second resistor connected in series to each other, and is connected in parallel to the first series circuit;
   an instruction unit configured to give an instruction to turn on the first switch and the second switch;
   a voltage output circuit configured to output a voltage value that corresponds to a voltage value between two ends of the first resistor; and
   a sensing unit configured to sense, when the instruction unit has given an instruction to turn on the first switch and the second switch, any occurrence of a failure in at least one of the first switch, the second switch, the first resistor, and the second resistor based on the voltage value output by the voltage output circuit, wherein the voltage value that is output by the voltage output circuit increases with an increase in the voltage value between the two ends of the first resistor, if the voltage value output by the voltage output circuit is less than a first threshold, the sensing unit senses that a failure has occurred in at least one of the first switch, the first resistor, and the second resistor, and if the voltage value output by the voltage output circuit is equal to or greater than a second threshold, the sensing unit senses that a failure has occurred in at least one of the second switch, the first resistor, and the second resistor, and the first threshold is less than the second threshold.

2. The control device according to claim 1, further comprising a voltage detection circuit configured to detect a voltage value of a connection node between the first switch and the first resistor, wherein, when having sensed that a failure has occurred in at least one of the first switch, the first resistor, and the second resistor, the sensing unit senses any occurrence of the failure in the first switch based on the voltage value detected by the voltage detection circuit.

3. The control device according to claim 2, further comprising a second voltage detection circuit configured to detect a voltage value of a connection node between the second switch and the second resistor, wherein, when having sensed that a failure has occurred in at least one of the second switch, the first resistor, and the second resistor, the sensing unit senses any occurrence of the failure in the second switch based on the voltage value detected by the second voltage detection circuit.

4. The control device according to claim 2, wherein an electric current flows through the first switch and the first resistor in this order, the voltage output circuit includes:
    a current output unit configured to draw the electric current from a connection node between the first switch and the first resistor, and output the drawn electric current; and
    a current resistor through which the electric current output by the current output unit flows, and the voltage output circuit outputs a voltage value between two ends of the current resistor.

5. The control device according to claim 1, further comprising a second voltage detection circuit configured to detect a voltage value of a connection node between the second switch and the second resistor, wherein, when having sensed that a failure has occurred in at least one of the second switch, the first resistor, and the second resistor, the sensing unit senses any occurrence of the failure in the second switch based on the voltage value detected by the second voltage detection circuit.

6. The control device according to claim 5, wherein an electric current flows through the first switch and the first resistor in this order, the voltage output circuit includes:
    a current output unit configured to draw the electric current from a connection node between the first switch and the first resistor, and output the drawn electric current; and
    a current resistor through which the electric current output by the current output unit flows, and the voltage output circuit outputs a voltage value between two ends of the current resistor.

7. The control device according to claim 1, wherein an electric current flows through the first switch and the first resistor in this order, the voltage output circuit includes:
    a current output unit configured to draw the electric current from a connection node between the first switch and the first resistor, and output the drawn electric current; and
    a current resistor through which the electric current output by the current output unit flows, and the voltage output circuit outputs a voltage value between two ends of the current resistor.

8. A control method comprising the steps of:

giving an instruction to turn on a first switch connected in series to a first resistor, and a second switch connected in series to a second resistor;

acquiring a voltage value that corresponds to a voltage value between two ends of the first resistor; and sensing, when an instruction to turn on the first switch and the second switch has been given, any occurrence of a failure in at least one of the first switch, the second switch, the first resistor, and the second resistor based on the acquired voltage value, wherein a first series circuit that includes the first switch and the first resistor is connected in parallel to a second series circuit that includes the second switch and the second resistor, the voltage value acquired in the step of acquiring increases with an increase in the voltage value between the two ends of the first resistor, the step of sensing includes the steps of:
    sensing, if the voltage value acquired in the step of acquiring is less than a first threshold, that a failure has occurred in at least one of the first switch, the first resistor, and the second resistor, and
    sensing, if the voltage value acquired in the step of acquiring is equal to or greater than a second threshold, that a failure has occurred in at least one of the second switch, the first resistor, and the second resistor, and the first threshold is less than the second threshold.

9. A computer program product comprising non-transitory, machine-readable medium storing instructions which, when executed by at least one programmable processor, caused at least one programmable processor to execute the steps of:

giving an instruction to turn on a first switch connected in series to a first resistor, and a second switch connected in series to a second resistor;

acquiring a voltage value that corresponds to a voltage value between two ends of the first resistor; and sensing, when an instruction to turn on the first switch and the second switch has been given, any occurrence of a failure in at least one of the first switch, the second switch, the first resistor, and the second resistor based on the acquired voltage value, wherein a first series circuit that includes the first switch and the first resistor is connected in parallel to a second series circuit that includes the second switch and the second resistor, the voltage value acquired in the step of acquiring increases with an increase in the voltage value between the two ends of the first resistor, the step of sensing includes the steps of:
- sensing, if the voltage value acquired in the step of acquiring is less than a first threshold, that a failure has occurred in at least one of the first switch, the first resistor, and the second resistor, and
- sensing, if the voltage value acquired in the step of acquiring is equal to or greater than a second threshold, that a failure has occurred in at least one of the second switch, the first resistor, and the second resistor, and the first threshold is less than the second threshold.

* * * * *